(12) United States Patent
Xiao et al.

(10) Patent No.: US 10,647,090 B2
(45) Date of Patent: May 12, 2020

(54) DISPLAY PANEL MOTHERBOARD, METHOD OF MANUFACTURING DISPLAY PANEL, AND DISPLAY APPARATUS

(71) Applicants: BOE TECHNOLOGY GROUP CO., LTD., Beijing (CN); Ordos Yuansheng Optoelectronics Co., Ltd., Ordos, Inner Mongolia (CN)

(72) Inventors: Ang Xiao, Beijing (CN); Fuyi Cui, Beijing (CN); Fujiang Jin, Beijing (CN); Quanqin Sun, Beijing (CN); Xiangnan Wang, Beijing (CN)

(73) Assignees: BOE TECHNOLOGY GROUP CO., LTD., Beijing (CN); ORDOS YUANSHENG OPTOELECTRONICS CO., LTD., Ordos, Inner Mongolia (CN)

( * ) Notice: Subject to any disclaimer, the term of this patent is extended or adjusted under 35 U.S.C. 154(b) by 70 days.

(21) Appl. No.: 15/576,268

(22) PCT Filed: Apr. 19, 2017

(86) PCT No.: PCT/CN2017/081047
§ 371 (c)(1),
(2) Date: Nov. 21, 2017

(87) PCT Pub. No.: WO2017/181950
PCT Pub. Date: Oct. 26, 2017

(65) Prior Publication Data
US 2018/0147817 A1 May 31, 2018

(30) Foreign Application Priority Data
Apr. 20, 2016 (CN) .......................... 2016 1 0246844

(51) Int. Cl.
*B32B 17/06* (2006.01)
*B32B 7/12* (2006.01)
(Continued)

(52) U.S. Cl.
CPC ................ *B32B 17/06* (2013.01); *B32B 7/12* (2013.01); *B32B 37/12* (2013.01);
(Continued)

(58) Field of Classification Search
CPC ........... B32B 17/06; B32B 37/12; B32B 7/12; B32B 38/0004; B32B 2457/206;
(Continued)

(56) References Cited

U.S. PATENT DOCUMENTS 7,834,550 B2 * 11/2010 Lee ..................... H01L 51/5246
313/512
9,391,294 B1 * 7/2016 Xiao .................... H01L 51/5246
(Continued)

FOREIGN PATENT DOCUMENTS

CN 1221201 A 6/1999
CN 103915391 A 7/2014
(Continued)

OTHER PUBLICATIONS

Second Chinese Office Action, for Chinese Patent Application No. 201610246844.3, dated Oct. 19, 2018, 11 pages.
(Continued)

*Primary Examiner* — David Sample
*Assistant Examiner* — Donald M Flores, Jr.
(74) *Attorney, Agent, or Firm* — Kinney & Lange, P.A.

(57) ABSTRACT

The present disclosure discloses a display panel motherboard, a method of manufacturing a display panel, and a display apparatus. The display panel motherboard includes a first substrate and a second substrate provided opposite to each other. The first substrate has a plurality of first zones
(Continued)

and a plurality of second regions, each of the plurality of first zones has a first display region and a first packaging material pattern on a periphery of the first display region, each of the plurality of second zones has a second packaging material pattern, and the second packaging material is at at least one side of the first packaging material pattern facing away from the first display region.

17 Claims, 5 Drawing Sheets

(51) Int. Cl.
*B32B 37/12* (2006.01)
*B32B 38/00* (2006.01)
*H01L 51/56* (2006.01)
*H01L 51/52* (2006.01)
*H01L 51/50* (2006.01)
*H01L 27/32* (2006.01)
*H05K 5/00* (2006.01)
*H05K 7/20* (2006.01)

(52) U.S. Cl.
CPC ...... *B32B 38/0004* (2013.01); *H01L 27/3223* (2013.01); *H01L 51/50* (2013.01); *H01L 51/529* (2013.01); *H01L 51/5237* (2013.01); *H01L 51/5246* (2013.01); *H01L 51/56* (2013.01); *B32B 2457/206* (2013.01); *H01L 2251/566* (2013.01); *H05K 5/0017* (2013.01); *H05K 7/20963* (2013.01); *Y10T 428/234* (2015.01); *Y10T 428/2495* (2015.01)

(58) Field of Classification Search
CPC ... H01L 51/529; H01L 51/5246; H01L 51/56; H01L 2251/566; H01L 51/50; H01L 27/3223; H01L 51/5237; Y10T 428/2495; Y10T 428/234; H05K 7/20963; H05K 5/0017

USPC .......................................................... 428/72
See application file for complete search history.

(56) References Cited

U.S. PATENT DOCUMENTS

| 9,876,191 | B2* | 1/2018 | Gai ................ H01L 51/5246 |
| 2001/0004281 | A1* | 6/2001 | Sasaki ................ G02F 1/1339 |
| | | | 349/190 |
| 2005/0088072 | A1* | 4/2005 | Yang ................ H01J 5/24 |
| | | | 313/292 |
| 2007/0194690 | A1* | 8/2007 | Lee ................ H01L 51/56 |
| | | | 313/498 |
| 2007/0196949 | A1* | 8/2007 | Lee ................ H01L 51/524 |
| | | | 438/99 |
| 2008/0297042 | A1* | 12/2008 | Ahn ................ H01L 27/3251 |
| | | | 313/504 |
| 2014/0043549 | A1 | 2/2014 | Taniguchi et al. |
| 2015/0349288 | A1* | 12/2015 | Luo ................ H01L 51/5237 |
| | | | 257/99 |

FOREIGN PATENT DOCUMENTS

| CN | 105097885 A | 11/2015 |
| CN | 105742333 A | 7/2016 |
| TW | I269918 B | 1/2007 |

OTHER PUBLICATIONS

International Search Report & Box V of Written Opinion, for PCT Patent Application No. PCT/CN2017/081047, dated Jul. 28, 2017, 6 pages.

First Chinese Office Action, for Chinese Patent Application No. 201610246844.3, dated Feb. 26, 2018, 16 pages.

* cited by examiner

DISPLAY PANEL MOTHERBOARD, METHOD OF MANUFACTURING DISPLAY PANEL, AND DISPLAY APPARATUS

CROSS-REFERENCE TO RELATED APPLICATION

This application is a 371 National Stage application of International Application No. PCT/CN2017/081047, filed on Apr. 19, 2017, which has not yet published, and which claims priority to Chinese Patent Application of which the patent application number is No. 201610246844.3, and which is filed on Apr. 20, 2016 in the State Intellectual Property Office of China, the present disclosure of which is hereby incorporated by reference in its entirety.

TECHNICAL FIELD

The present disclosure relates to the field of display technology, and particularly, to a display panel motherboard, a method of manufacturing a display panel, and a display apparatus.

BACKGROUND

OLED (Organic Light-Emitting Diode) display panel generally includes two parts, a back plate glass and a cover plate glass printed with glass glue. A display panel can be obtained after gluing the back plate glass to the cover plate glass.

SUMMARY

According to a first aspect of the present disclosure, there is provided a display panel motherboard, comprising a first substrate and a second substrate provided opposite to each other; wherein, the first substrate has a plurality of first zones and a plurality of second zones, each of the plurality of first zones has a first display region and a first packaging material pattern on a periphery of the first display region, each of the plurality of second zones has a second packaging material pattern, and the second packaging material pattern is at at least one side of the first packaging material pattern facing away from the first display region.

In an embodiment, the second substrate has a second display region opposite to the first display region, the second substrate further has a plurality of heat dissipating layers and a plurality of structural supports at at least one side of each of the heat dissipating layers facing away from the second display region, positions of the plurality of heat dissipating layers correspond to positions of the plurality of first packaging material patterns on the first substrate, and positions of the plurality of structural supports correspond to positions of the plurality of second packaging material patterns on the first substrate.

In an embodiment, a height of the first packaging material pattern equals to a height of the second packaging material pattern located at the at least one side of the first packaging material pattern facing away from the first display region.

In an embodiment, a height difference between a height of the first packaging material pattern and a height of the second packaging material pattern located at the at least one side of the first packaging material pattern facing away from the first display region is less than or equals to a specified difference value.

In an embodiment, the specified difference value is 0.2 µm.

In an embodiment, a height of the heat dissipating layer equals to a height of the plurality of structural supports located at the at least one side of the heat dissipating layer facing away from the second display region.

In an embodiment, a height difference between a height of the heat dissipating layer and a height of the plurality of structural supports located at the at least one side of the heat dissipating layer facing away from the second display region is less than or equals to a specified difference value.

In an embodiment, the specified difference value is 0.2 µm.

In an embodiment, for each first packaging material pattern of the plurality of first packaging material patterns, the plurality of second packaging material patterns are at each of sides, except a specified side that is for provision of an integrated circuit, of the each first packaging material pattern facing away from the first display region.

In an embodiment, for each second packaging material pattern of the plurality of second packaging material patterns, a section of the each second packaging material pattern is rectangular.

In an embodiment, for each first packaging material pattern of the plurality of first packaging material patterns, a respective packaging material pattern side of the each first packaging material pattern and the second packaging material pattern located at the respective side are parallel to each other.

In an embodiment, a distance between the respective packaging material pattern side of the each first packaging material pattern and the second packaging material pattern located at the respective side is greater than or equals to 0.4 mm.

In an embodiment, the first substrate is a cover plate and the second substrate is a back plate; or, the first substrate is a back plate and the second substrate is a cover plate.

According to a second aspect of the present disclosure, there is provided a method of manufacturing a display panel, the method comprising:

forming, with a mask, packaging material patterns on a first substrate, the packaging material patterns comprising a plurality of first packaging material patterns and a plurality of second packaging material patterns at at least one side of each of the first packaging material patterns facing away from a first display region of the first substrate, each of the plurality of first packaging material patterns being on a periphery of the first display region;

gluing a second substrate to the first substrate formed with the packaging material patterns, to obtain a display panel motherboard;

cutting regions of the display panel motherboard where the plurality of second packaging material patterns at the at least one side of the each of the first packaging material patterns facing away from the first display region are located, to obtain a plurality of display panels.

In an embodiment, forming, by one patterning process, a plurality of heat dissipating layers and a plurality of structural supports at at least one side of each of the heat dissipating layers facing away from a second display region of the second substrate, on the second substrate, positions of the plurality of heat dissipating layers corresponding to positions of the plurality of first packaging material patterns on the first substrate, positions of the plurality of structural supports corresponding to positions of the plurality of second packaging material patterns on the second substrate;

gluing the first substrate formed with the packaging material patterns to the second substrate formed with the plurality of heat dissipating layers and the plurality of structural supports, to obtain the display panel motherboard.

In an embodiment, the gluing the first substrate formed with the packaging material patterns to the second substrate formed with the plurality of heat dissipating layers and the plurality of structural supports, to obtain the display panel motherboard, comprises the following step of:

gluing the plurality of first packaging material patterns to the plurality of heat dissipating layers, and gluing the plurality of second packaging material patterns to the plurality of structural supports, to obtain the display panel motherboard.

According to a third aspect of the present disclosure, there is provided a display apparatus comprising the abovementioned display panel.

BRIEF DESCRIPTION OF THE DRAWINGS

In order to provide a more clear explanation of technical solutions in embodiments of the present disclosure, there is provided a brief introduction of the attached drawings used in the following description of the embodiments. Obviously, the drawings mentioned in the following description belong to some embodiments of the present disclosure. However, for those skilled in the art, other drawings may be achieved on the basis of these attached drawings without involving any inventive steps.

DETAILED DESCRIPTION OF THE EMBODIMENTS

In order to provide a more clear understanding of objects, technique solutions and advantages of the present disclosure, the embodiments of the present disclosure will be further described hereinafter in detail and completely with reference to the attached drawings.

It has been found by the inventor(s) that, in a conventional display panel, a low-pressure blank region exists between two adjacent display regions. Under the action of atmospheric pressure, deformation may occur on the cover plate glass and the back plate glass at the low-pressure blank region, so that an external incident light will generates interference fringe, that is, Newton ring. Presence of the Newton ring will adversely affect display quality of the display panel.

According to one embodiment of the present invention, a method of improving the display panel in order to eliminate occurrence of Newton ring at the low-pressure blank region may comprise: decreasing an area of the low-pressure blank region in manufacturing the display panel, to reduce degrees of deformation of the cover plate glass and the back plate glass so as to eliminate occurrence of Newton ring.

However, the OLED display panel is packaged through glass glue and the cover plate glass and the back plate glass have certain toughness, consequently, toughness of the cover plate glass and the back plate glass is also reduced when reducing degrees of deformation of the cover plate glass and the back plate glass, which brings a crushing problem of cuttings when cutting the display panel.

Some other embodiments of the present invention will be described hereinafter in detail with reference to FIGS. 1-7.

Figure 1:
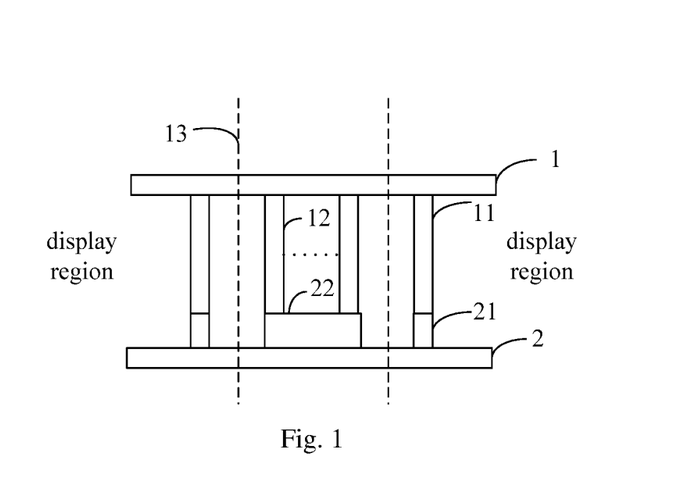
FIG. 1 is a schematic view showing a structure of a display panel motherboard according to an embodiment of the present disclosure.

FIG. 1 is a schematic view showing a structure of a display panel motherboard according to an embodiment of the present disclosure. Referring to FIG. 1, the display panel motherboard comprises a first substrate 1 and a second substrate 2. In one example, the first substrate 1 may be a cover plate and the second substrate 2 may be a back plate. In an alternative example, the first substrate 1 may be a back plate and the second substrate 2 may be a cover plate.

Figure 2:
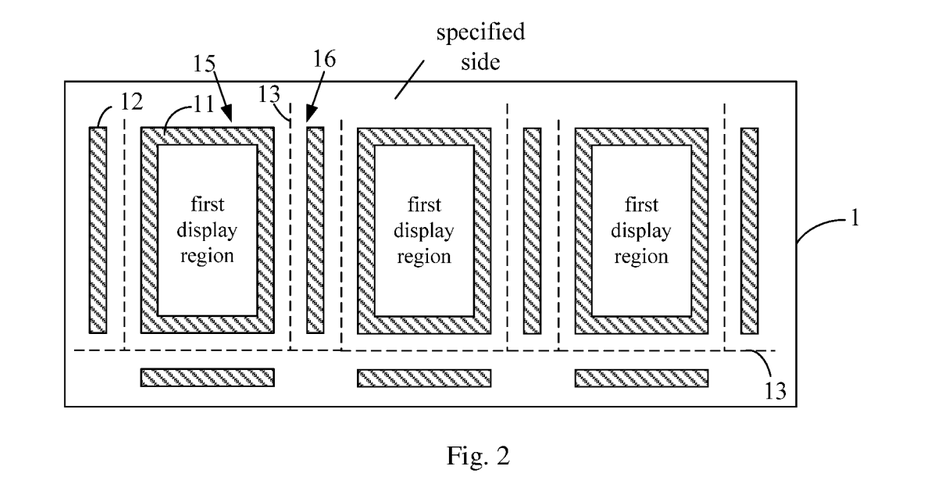
FIG. 2 is a schematic sectional view showing the structure of the display panel motherboard according to the embodiment of the present disclosure.

In combination to FIG. 2, the first substrate 1 has a plurality of first zones 15 and a plurality of second zones 16, each of the plurality of first zones 15 has a first display region and a first packaging material pattern 11 on a periphery of the first display region, each of the plurality of second zones 16 has a second packaging material pattern 12, and the second packaging material pattern 12 is located at at least one side of the first packaging material pattern 11 facing away from the first display region. In one example, the second zones may be zones to be cut. That is, the cover plate 1 has a plurality of first packaging material patterns 11 and a plurality of second packaging material patterns 12 outside each of the first packaging material patterns 11. The back plate 2 has a plurality of first display regions formed thereon. Each first packaging material pattern 11 of the plurality of first packaging material patterns 11 is located outside a respective one of the first display regions of the back plate 2.

On the cover plate 1 of the display panel motherboard not only the plurality of first packaging material patterns 11 are formed, but also the plurality of second packaging material patterns 12 are provided outside each of the first packaging material patterns 11, and, each first packaging material pattern 11 of the plurality of first packaging material patterns 11 is outside a respective first display region of the back plate. Hence, it is ensured that, in the display panel, the cover plate 1 is paralleled to the back plate 2, and accordingly it can be ensured that no deformation occurs on the cover plate 1 and the back plate 2 located in the non-display region under the action of atmospheric pressure, thereby eliminating occurrence of Newton ring. Meanwhile, since, in the embodiments of the present disclosure, the area of the non-display region is unchanged, toughness of the back plate 2 and the cover plate 1 is unchanged accordingly, which causes no crushing problem of cuttings when cutting the display panel.

Referring to FIG. 1, a height of the first packaging material pattern 11 equals to a height of the second packaging material pattern 12 located outside the first packaging material pattern 11. Of course, in practical application, the height of the first packaging material pattern 11 may not equal to the height of the second packaging material pattern 12 located outside the first packaging material pattern 11, and specific limitation on this is not made in embodiments of the present disclosure.

It should be noted that, in case that the height of the first packaging material pattern 11 does not equal to the height of the second packaging material pattern 12 located outside the first packaging material pattern 11, in order to eliminate occurrence of Newton ring, a height difference between the height of the first packaging material pattern 11 and the height of the second packaging material pattern 12 located outside the first packaging material pattern 11 may be less than or equal to a specified difference value.

It should be noted that, the specified difference value may be 0.2 µm. Of course, in practical application, the specified difference value may be other values, and specific limitation on this is not made in embodiments of the present disclosure.

Figure 7:
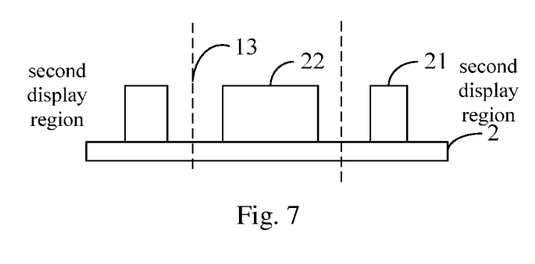
FIG. 7 is a schematic view showing a structure of a back plate according to an embodiment of the present disclosure.

Referring to FIG. 1 in combination with FIG. 7, the second substrate 2 has a second display region opposite to the first display region, the second substrate 2 further has a plurality of heat dissipating layers 21 and a plurality of structural supports 22 located at at least one side of each heat dissipating layer facing away from the second display region, positions of the plurality of heat dissipating layers 21 correspond to positions of the plurality of first packaging material patterns 11 on the first substrate, and positions of the plurality of structural supports 22 correspond to positions of the plurality of second packaging material patterns 12 on the first substrate. That is, the back plate 2 has the plurality of heat dissipating layers 21 and the plurality of structural supports 22 located outside each heat dissipating layer 21. Positions of the plurality of heat dissipating layers 21 correspond to positions of the plurality of first packaging material patterns 11 on the cover plate 1, and positions of the plurality of structural supports 22 correspond to positions of the plurality of second packaging material patterns 12 located outside each first packaging material pattern 11 on the cover plate 1. And, a height of the heat dissipating layer 21 equals to a height of the structural support 22 located outside the heat dissipating layer 21.

It should be noted that, in practical application, the height of the heat dissipating layer 21 may not equal to the height of the structural support 22 located outside the heat dissipating layer 21. In case that the height of the heat dissipating layer 21 does not equal to the height of the structural support 22 located outside the heat dissipating layer 21, a height difference between the height of the heat dissipating layer 21 and the height of the structural support 22 may be less than or equal to a specified difference value, and the specified difference value may be 0.2 µm or may be other values, and specific limitation on this is not made in embodiments of the present disclosure.

In addition, in embodiments of the present disclosure, a material for forming the cover plate and the back plate may be glass material or may be other materials, and specific limitation on this is not made in embodiments of the present disclosure.

It should be further noted that, the packaging material is for packaging the cover plate and the back plate. The packaging material may be glass glue or may be other packaging material, and specific limitation on this is not made in embodiments of the present disclosure.

Referring to FIG. 1, for each first packaging material pattern 11 of the plurality of first packaging material patterns 11, the plurality of second packaging material patterns 12 are at each of sides, excepting at a specified side that is for provision of an integrated circuit, of the first packaging material pattern 11.

It should be noted that, because the specified side is for provision of the integrated circuit, if the second packaging material pattern 12 is provided on the specified side, lapping of the integrated circuit is affected, and thus display quality of the display panel is adversely affected. Accordingly, no second packaging material pattern 12 is provided on the specified side, so that no packaging material is applied on the side, for provision of the integrated circuit, of the display panel, and thus effective lapping of the integrated circuit is ensured.

FIG. 2 is a schematic sectional view showing the structure of the display panel motherboard according to the embodiment of the present disclosure. Referring to FIG. 2, for each second packaging material pattern of the plurality of second packaging material patterns, a section of the each second packaging material pattern 12 may have a rectangular shape.

It should be noted that, the section of the second packaging material pattern 12 may have the rectangular shape or may be of other shapes including a circular shape and a trapezoidal shape, and specific limitation on this is not made in embodiments of the present disclosure. In order to facilitate cutting of the display panel, the section of the second packaging material pattern 12 generally has the rectangular shape.

Referring to FIG. 2, for each first packaging material pattern 11 of the plurality of first packaging material patterns 11, a respective packaging material pattern side of the first packaging material pattern 11 and the second packaging material pattern 12 located at the respective side parallel to each other.

Because a cutting line 13 is located between the first packaging material pattern 11 and the second packaging material pattern 12 and the cutting line 13 is usually a straight line, when cutting the display panel motherboard, in case that the respective packaging material pattern side of the first packaging material pattern 11 and the second packaging material pattern 12 located at the respective side parallel to each other, the display panel motherboard can be cut conveniently.

It should be noted that, a distance between the respective packaging material pattern side of each first packaging material pattern 11 and the second packaging material pattern 12 located at the respective side of the each first packaging material pattern 11 is greater than or equals to 0.4 mm.

When cutting the display panel motherboard, a crushing problem of cuttings will occur when a distance between the cutting line 13 and the first packaging material pattern 11 is less than 0.2 mm. Accordingly, in embodiments of the present disclosure, the distance between the first packaging material pattern 11 and the second packaging material pattern 12 is greater than or equals to 0.4 mm, in this way, the distance between the cutting line 13 and the first packaging material pattern 11 is greater than or equals to 0.2 mm, thereby avoiding a glass crushing problem when cutting.

In the embodiments of the present disclosure, on the cover plate of the display panel motherboard not only the plurality of first packaging material patterns are formed, but also the plurality of second packaging material patterns are provided outside each of the first packaging material patterns, and, each first packaging material pattern of the plurality of first packaging material patterns is located outside each display region of the back plate, and heights of the first packaging material pattern outside the display region and of the second packaging material pattern in the non-display region are the same. Moreover, the back plate has a plurality of heat dissipating layers and a plurality of structural supports located outside each of the heat dissipating layers, positions of the plurality of heat dissipating layers correspond to positions of the plurality of first packaging material patterns on the cover plate, and positions of the plurality of structural supports correspond to a position of at least one second packaging material pattern on the cover plate, and the height of the plurality of heat dissipating layers and the height of the plurality of structural supports are the same. Hence, it is ensured that, in the display panel, the cover plate is paralleled to the back plate, and accordingly it can be ensured that no deformation occurs on the cover plate and the back plate located in the non-display region under the action of atmospheric pressure, thereby eliminating occurrence of Newton ring. In addition, since, in the embodiments of the present disclosure, the area of the non-display region is unchanged, toughness of the back plate and the cover plate is unchanged accordingly, which causes no crushing problem of cuttings when cutting the display panel. Furthermore, the distance between the respective packaging material pattern side of the first packaging material pattern and the second packaging material pattern located at the respective side of the first packaging material pattern is greater than or equals to 0.4 mm, so that it can be ensured that the distance between the cutting line and the first packaging material pattern is greater than or equals to 0.2 mm, thereby further avoiding a glass crushing problem in cuttings of the display panel.

Figure 3:
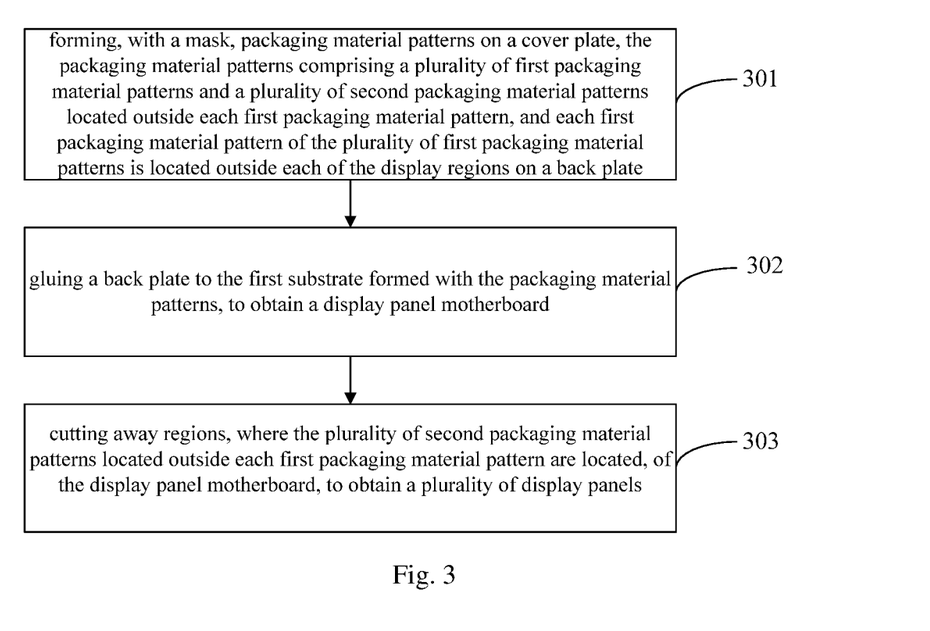
FIG. 3 is a flow diagram showing a method of manufacturing a display panel according to an embodiment of the present disclosure.

FIG. 3 is a flow diagram showing a method of manufacturing a display panel according to an embodiment of the present disclosure. Referring to FIG. 3, the method comprises:

a step 301 of, forming, with a mask, packaging material patterns on a first substrate (for example a cover plate), wherein the packaging material patterns comprise a plurality of first packaging material patterns and a plurality of second packaging material patterns located at at least one side of (namely located outside) each first packaging material pattern facing away from a first display region of the first substrate, and each first packaging material pattern of the plurality of first packaging material patterns is on a periphery of each first display region on the first substrate;

a step 302 of, gluing a second substrate (for example a back plate) to the first substrate formed with the packaging material patterns, to obtain a display panel motherboard;

a step 303 of, cutting the plurality of second packaging material patterns, which are located at at least one side of each first packaging material pattern facing away from the first display region, of the display panel motherboard, to obtain a plurality of display panels.

In the embodiments of the present disclosure, the plurality of first packaging material patterns and the plurality of second packaging material patterns on the cover plate are formed in one patterning process. Accordingly, heights of the plurality of first packaging material patterns and of the plurality of second packaging material patterns are the same completely. Moreover, the plurality of heat dissipating layers and the plurality of structural supports on the back plate are formed in one patterning process. Accordingly, heights of the plurality of heat dissipating layers and of the plurality of structural supports are the same. After implementing a gluing of the back plate to the cover plate, the back plate is completely parallel to the cover plate. In this way, when cutting the display panel motherboard, the glass crushing problem of cuttings can be avoided, and the occurrence of Newton ring is eliminated, which improves display quality of the display panel.

Alternative embodiments of the present disclosure can be achieved by combining the above optional technical solutions with one another in any manner without conflicting, and the description on this is omitted in the embodiments of the present disclosure for the sake of brevity.

Figure 4:
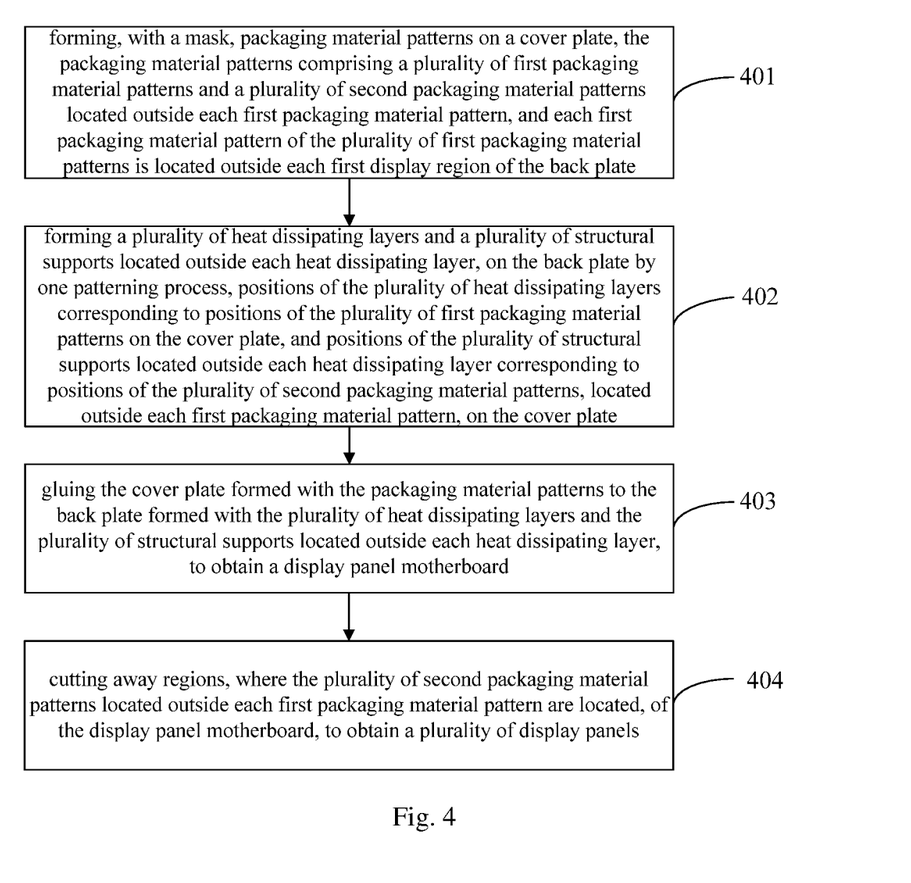
FIG. 4 is a flow diagram showing another method of manufacturing a display panel according to an embodiment of the present disclosure.

FIG. 4 is a flow diagram showing a method of manufacturing a display panel according to an embodiment of the present disclosure. Referring to FIG. 4, in a step 401, packaging material patterns are formed, with a mask, on the first substrate (for example a cover plate). The packaging material patterns comprises a plurality of first packaging material patterns and a plurality of second packaging material patterns located outside each first packaging material pattern, and each first packaging material pattern of the plurality of first packaging material patterns is on a periphery of each first display region of the first substrate.

Figure 5:
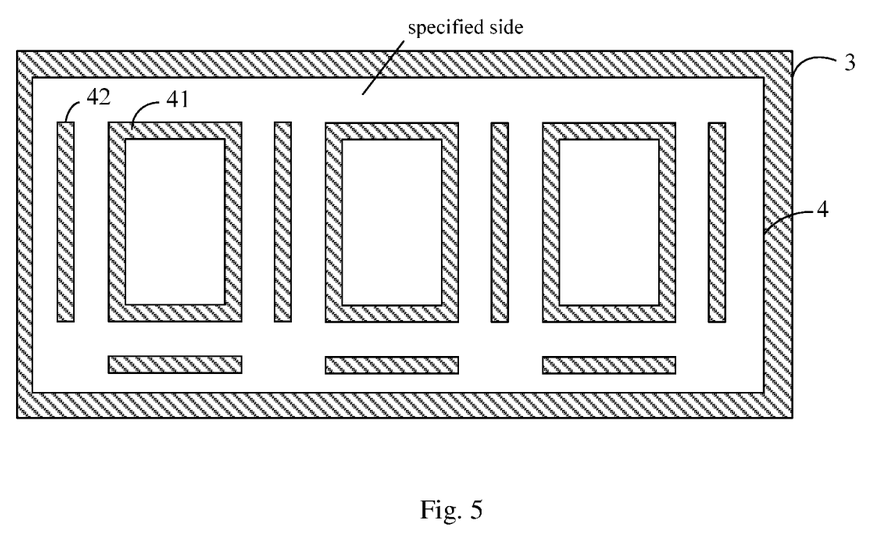
FIG. 5 is a schematic view showing a structure of a mask according to an embodiment of the present disclosure.

Specifically, a layer of packaging material is coated on the cover plate, and then, with the mask shown in FIG. 5, the packaging material coated on the cover plate is processed to form the plurality of first packaging material patterns each of which is located on the periphery of the display region and the plurality of second packaging material patterns located outside each first packaging material pattern of the plurality of first packaging material patterns.

Referring to FIG. 5, the mask comprises a silk screen 3 and an emulsion layer 4 provided above the silk screen 3. The emulsion layer 4 has a plurality of first patterns 41 running therethrough in a thickness direction, and the plurality of first patterns 41 are for forming the first packaging material patterns on the cover plate. For each first pattern 41 of the plurality of first patterns 41, outside the first pattern 41 are a plurality of second patterns 42 running through the emulsion layer 4 in the thickness direction, and the second patterns 42 are for forming the second packaging material patterns on the cover plate Likely, the second patterns 42 are at each of sides, excepting a specified side, of the first patterns 41. A distance between the respective pattern side of the first pattern 41 and the second pattern 42 located at the respective side of the first pattern 41 is greater than or equals to 0.4 mm.

Figure 6:
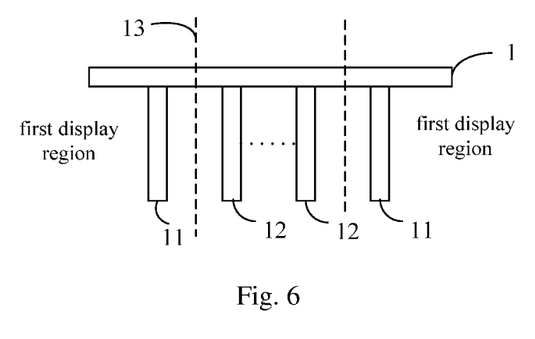
FIG. 6 is a schematic view showing a structure of a cover plate according to an embodiment of the present disclosure.

Referring to FIG. 6, the cover plate 1 is formed with the plurality of first packaging material patterns 11 each of which are located outside the display region and the plurality of second packaging material patterns 12 located outside each first packaging material pattern 11. That is, each first packaging material pattern 11 of the plurality of first packaging material patterns 11 is located outside the display region.

It should be noted that, the packaging material patterns on the cover plate are formed with the mask shown in FIG. 5, and each of sides, excepting the specified side of the first pattern, of the mask has the plurality of second patterns. Accordingly, when forming, with the mask shown in FIG. 5, the packaging material patterns on the cover plate, for each first packaging material pattern of the plurality of first packaging material patterns, each of sides, excepting the specified side, of the first packaging material patterns can be formed with the plurality of second packaging material patterns.

In addition, the packaging material patterns on the cover plate are formed with the mask shown in FIG. 5, and the distance between the respective pattern side of the first pattern and the second pattern located at the respective side of the first pattern, on the mask, is greater than or equals to 0.4 mm, in this way, a distance between the cutting line and the respective pattern side of the first pattern is also greater than or equals to 0.2 mm. Accordingly, when forming, with the mask shown in FIG. 5, the packaging material patterns on the cover plate, it can be ensured that the distance between the respective packaging material pattern side of the first packaging material patterns and the second packaging material pattern located at the respective side of the first packaging material pattern is greater than or equals to 0.4 mm, and thus it can be ensured that a distance between the cutting line and the respective packaging material pattern side of the first packaging material pattern is greater than or equals to 0.2 mm.

In addition, operating methods of processing, with the mask, the package material coated on the cover plate may refer to related technologies, and the description on this is omitted in the embodiments of the present disclosure for the sake of brevity.

In the step 402, a plurality of heat dissipating layers and, a plurality of structural supports outside each heat dissipating layer, are formed on the back plate by one patterning process. Positions of the plurality of heat dissipating layers correspond to positions of the plurality of first packaging material patterns on the cover plate, and positions of the plurality of structural supports located outside each heat dissipating layer correspond to positions of, the plurality of second packaging material patterns located outside each first packaging material pattern, on the cover plate.

Both the plurality of heat dissipating layers and the plurality of structural supports outside each heat dissipating layer are formed by one patterning process, accordingly, heights of the plurality of heat dissipating layers 21 and of the plurality of structural supports 22, which are formed on the back plate 2, are the same.

Referring to FIG. 7, on the back plate 2, a plurality of heat dissipating layers 21 and a plurality of structural supports 22 located outside each heat dissipating layer are formed outside the display region.

It should be noted that, operating methods of forming the heat dissipating layers and the structural supports on the back plate by one patterning process are similar to or the same as those of forming the heat dissipating layers on the back plate, and the description on this is omitted in the embodiments of the present disclosure for the sake of brevity.

It should be further noted that, every side of each first packaging material pattern may be provided with a plurality of second packaging material patterns, accordingly, one structural support may correspond to one second packaging material pattern, or else may correspond to a plurality of second packaging material patterns, and specific limitation on this is not made in embodiments of the present disclosure.

In the step 403, the cover plate formed with the packaging material patterns is glued to the back plate formed with the plurality of heat dissipating layers and the plurality of structural supports located outside each heat dissipating layer, to obtain the display panel motherboard.

Positions of the plurality of heat dissipating layers on the back plate correspond to positions of the plurality of first packaging material patterns on the cover plate, and Positions of the plurality of structural supports on the back plate correspond to positions of the plurality of second packaging material patterns on the cover plate, accordingly, an operation of implementing a gluing process on the cover plate formed with the packaging material patterns and the back plate formed with the plurality of heat dissipating layers and the plurality of structural supports located outside each heat dissipating layer, to obtain the display panel motherboard, may comprise: implementing a gluing process on the plurality of first packaging material patterns and the plurality of heat dissipating layers, and implementing a gluing process on the plurality of second packaging material patterns and the plurality of structural supports, to obtain the display panel motherboard.

Referring to FIG. 1, after implementing a gluing process on the cover plate 1 and the back plate 2, the plurality of heat dissipating layers 21 on the back plate 2 are glued to the plurality of first packaging material patterns 11 on the cover plate 1, and the plurality of structural supports 22 on the back plate 2 are glued to the plurality of second packaging material patterns 12 on the cover plate 1, and the distance between the cutting line 13 and the first packaging material pattern 11 is greater than or equals to 0.2 mm.

It should be noted that, operating methods of implementing a gluing process on the cover plate and the back plate may refer to related technologies, and the description on this is omitted in the embodiments of the present disclosure for the sake of brevity.

Heights of the plurality of first packaging material patterns and of the plurality of second packaging material patterns are the same, heights of the plurality of heat dissipating layers and of the plurality of structural supports are the same, by implementing a gluing process on the plurality of first packaging material patterns and the plurality of heat dissipating layers, and implementing a gluing process on the plurality of second packaging material patterns and the plurality of structural supports, it is ensured that, the cover plate is completely paralleled to the back plate, thereby eliminating occurrence of Newton ring.

In the step 404, regions, where the plurality of second packaging material patterns outside each first packaging material pattern are located, of the display panel motherboard are cut away, to obtain a plurality of display panels.

The display panels are obtained by cutting the display panel motherboard, and a picture displaying portion of the display panel is the portion of the display panel motherboard where the display region is located, accordingly, it is required to cut away the regions, where the plurality of second packaging material patterns outside each first packaging material pattern are located, of the display panel motherboard, while reserving the display regions in the display panel motherboard, in order to obtain the plurality of display panel.

Positions of the plurality of heat dissipating layers on the back plate correspond to those of the plurality of first packaging material patterns on the cover plate, and positions of the plurality of structural supports on the back plate correspond to those of the plurality of second packaging material patterns on the cover plate, accordingly, while regions, where the plurality of second packaging material patterns outside each first packaging material pattern are located, of the display panel motherboard are cut away, regions where the plurality of structural supports are located are also cut away.

It should be noted that, operating methods of cutting the display panel motherboard in order to obtain the display panels may refer to related technologies, and the description on this is omitted in the embodiments of the present disclosure for the sake of brevity.

In the embodiments of the present disclosure, the plurality of first packaging material patterns and the plurality of second packaging material patterns on the cover plate are formed in one patterning process. Accordingly, heights of the plurality of first packaging material patterns and of the plurality of second packaging material patterns are the same completely. Moreover, the plurality of heat dissipating layers and the plurality of structural supports on the back plate are formed in one patterning process. Accordingly, heights of the plurality of heat dissipating layers and of the plurality of structural supports are the same. After implementing a gluing of the back plate to the cover plate, the back plate is completely parallel to the cover plate. In this way, when cutting the display panel motherboard to obtain the display panels, the crushing problem of cuttings can be avoided, and the occurrence of Newton ring is eliminated, which improves display quality of the display panel.

According to embodiments of the present disclosure, there also provides a display apparatus which may comprise the display panel of the abovementioned embodiments.

It should be noted that, the display apparatus not only may include the display panel of the abovementioned embodiments, but also may include other components, for example, processor, integrated display circuit and the like. Specific limitation on this is not made in embodiments of the present disclosure.

In embodiments of the present disclosure, the display panel which can eliminate occurrence of Newton ring is included in the display apparatus, accordingly, during a picture displaying, no Newton ring occurs in the display apparatus, which increases display quality of the display apparatus.

The above merely are optional embodiments of the present disclosure, but the present disclosure is not limited to this. Changes, equivalent replacements and modifications on these embodiments made without departing from the principles and spirit of the present disclosure should be contained within the scope of the present disclosure.

What is claimed is:

1. An OLED display panel motherboard, comprising a first substrate and a second substrate provided opposite to each other; wherein, the first substrate has a plurality of first zones and a plurality of second zones, each of the plurality of first zones has a first display region and a first packaging material pattern on a periphery of the first display region, each of the plurality of second zones has a second packaging material pattern, and the second packaging material patterns are formed between every two adjacent first packaging material patterns and on a side of the first packaging material pattern facing away from the first display region, respectively;

the second substrate has a second display region opposite to the first display region, the second substrate further has a plurality of heat dissipating layers and a plurality of structural supports on at least one side of each of the heat dissipating layers facing away from the second display region, positions of the plurality of heat dissipating layers correspond to positions of the plurality of first packaging material patterns on the first substrate, and positions of the plurality of structural supports correspond to positions of the plurality of second packaging material patterns on the first substrate; and both the first packaging material pattern and the second packaging material pattern are made of glass glue.

2. The OLED display panel motherboard of claim 1, wherein, a height of the first packaging material pattern is equal to a height of the second packaging material pattern located on the at least one side of the first packaging material pattern facing away from the first display region.

3. The OLED display panel motherboard of claim 2, wherein, for each first packaging material pattern of the plurality of first packaging material patterns, a respective packaging material pattern side of the each first packaging material pattern and the second packaging material pattern located on the respective side are parallel to each other.

4. The OLED display panel motherboard of claim 1, wherein, a height difference between a height of the first packaging material pattern and a height of the second packaging material pattern located on the at least one side of the first packaging material pattern facing away from the first display region is less than or equal to a specified difference value greater than zero.

5. The OLED display panel motherboard of claim 4, wherein, the specified difference value is 0.2 µm.

6. The OLED display panel motherboard of claim 4, wherein, for each first packaging material pattern of the plurality of first packaging material patterns, a respective packaging material pattern side of each first packaging material pattern and the second packaging material pattern located on the respective side are parallel to each other.

7. The OLED display panel motherboard of claim 1, wherein, a height of the heat dissipating layer is equal to a height of the plurality of structural supports located on the at least one side of the heat dissipating layer facing away from the second display region.

8. The OLED display panel motherboard of claim 1, wherein, a height difference between a height of the heat dissipating layer and a height of the plurality of structural supports located on the at least one side of the heat dissipating layer facing away from the second display region is less than or equal to a specified difference value greater than zero.

9. The OLED display panel motherboard of claim 8, wherein the specified difference value is 1.2 µm.

10. The OLED display panel motherboard of claim 1, wherein, for each first packaging material pattern of the plurality of first packaging material patterns, the plurality of second packaging material patterns are on each of the sides, except a specified side that is for provision of an integrated circuit, of the each first packaging material pattern facing away from the first display region.

11. The OLED display panel motherboard of claim 1, wherein, for each second packaging material pattern of the plurality of second packaging material patterns, a section of the each second packaging material pattern is rectangular.

12. The OLED display panel motherboard of claim 1, wherein, for each first packaging material pattern of the plurality of first packaging material patterns, a respective packaging material pattern side of the each first packaging material pattern and the second packaging material pattern located on the respective side are parallel to each other.

13. The OLED display panel motherboard of claim 12, wherein, a distance between the respective packaging material pattern side of the each first packaging material pattern and the second packaging material pattern located on the respective side is greater than or equals to 0.4 mm.

14. The OLED display panel motherboard of claim 1, wherein, the first substrate is a cover plate and the second substrate is a back plate; or the first substrate is a back plate and the second substrate is a cover plate.

15. A method of manufacturing an OLED display panel, the method comprising:

forming, with a mask, packaging material patterns on a first substrate, the packaging material patterns comprising a plurality of first packaging material patterns and a plurality of second packaging material patterns between every two adjacent first packaging material patterns and on a side of each of the first packaging material patterns facing away from a first display region of the first substrate, respectively, each of the plurality of first packaging material patterns being on a periphery of the first display region;

gluing a second substrate to the first substrate formed with the packaging material patterns, to obtain an OLED display panel motherboard;

cutting regions of the OLED display panel motherboard where the plurality of second packaging material patterns on the at least one side of the each of the first packaging material patterns facing away from the first display region are located, to obtain a plurality of OLED display panels, wherein, the gluing the second substrate to the first substrate formed with the packaging material patterns, to obtain the OLED display panel motherboard, comprises the following steps of:

forming, by one patterning process, a plurality of heat dissipating layers and a plurality of structural supports on at least one side of each of the heat dissipating layers facing away from a second display region of the second substrate, on the second substrate, positions of the plurality of heat dissipating layers corresponding to positions of the plurality of first packaging material patterns on the first substrate, positions of the plurality of structural supports corresponding to positions of the plurality of second packaging material patterns on the first substrate; and gluing the first substrate formed with the packaging material patterns to the second substrate formed with the plurality of heat dissipating layers and the plurality of structural supports, to obtain the OLED display panel motherboard; and wherein both the first packaging material and the second packaging material pattern are made of glass glue.

16. The method of claim 15, wherein, the gluing the first substrate formed with the packaging material patterns to the second substrate formed with the plurality of heat dissipating layers and the plurality of structural supports, to obtain the OLED display panel motherboard, comprises the following step of:

gluing the plurality of first packaging material patterns to the plurality of heat dissipating layers, and gluing the plurality of second packaging material patterns to the plurality of structural supports, to obtain the OLED display panel motherboard.

17. An OLED display apparatus, comprising an OLED display panel manufactured by the method of claim 15.

* * * * *